United States Patent
Taylor et al.

(10) Patent No.: US 7,808,487 B2
(45) Date of Patent: *Oct. 5, 2010

(54) SYSTEM FOR DISPOSING A PROXIMITY SENSITIVE TOUCHPAD BEHIND A MOBILE PHONE KEYMAT

(75) Inventors: Brian Taylor, Sandy, UT (US); Michael D. Layton, Salt Lake City, UT (US); David Taylor, Salt Lake City, UT (US)

(73) Assignee: Cirque Corporation, Salt Lake City, UT (US)

( * ) Notice: Subject to any disclaimer, the term of this patent is extended or adjusted under 35 U.S.C. 154(b) by 777 days.

This patent is subject to a terminal disclaimer.

(21) Appl. No.: 11/641,620

(22) Filed: Dec. 19, 2006

(65) Prior Publication Data

US 2007/0115263 A1  May 24, 2007

Related U.S. Application Data

(63) Continuation of application No. 10/165,182, filed on Jun. 6, 2002, now Pat. No. 7,151,528.

(51) Int. Cl.
*G09G 5/00* (2006.01)

(52) U.S. Cl. ............... 345/168; 345/169; 345/175; 200/5 A

(58) Field of Classification Search ......... 345/156, 345/168, 169, 172–175; 200/5 A, 6 R; 341/20–26
See application file for complete search history.

(56) References Cited

U.S. PATENT DOCUMENTS

| | | | |
|---|---|---|---|
| 4,700,377 A * | 10/1987 | Yasuda et al. | 379/88.16 |
| 5,252,971 A * | 10/1993 | Franz et al. | 341/26 |
| 5,341,133 A | 8/1994 | Savoy et al. | |
| 5,565,658 A * | 10/1996 | Gerpheide et al. | 178/18.02 |
| 5,675,361 A | 10/1997 | Santilli | |
| 5,864,334 A | 1/1999 | Sellers | |
| 5,909,210 A | 6/1999 | Knox et al. | |
| 5,923,267 A * | 7/1999 | Beuk et al. | 340/825.56 |
| 6,204,839 B1 * | 3/2001 | Mato, Jr. | 345/168 |
| 6,243,080 B1 | 6/2001 | Molne | |
| 6,288,707 B1 | 9/2001 | Philipp | |
| 6,369,803 B2 * | 4/2002 | Brisebois et al. | 345/173 |
| 6,924,789 B2 | 8/2005 | Bick | |
| 7,151,528 B2 * | 12/2006 | Taylor et al. | 345/168 |

FOREIGN PATENT DOCUMENTS

| | | | |
|---|---|---|---|
| EP | 000419145 A1 * | 3/1991 | |
| JP | 10260763 A | 9/1998 | |

* cited by examiner

*Primary Examiner*—Kimnhung Nguyen
(74) *Attorney, Agent, or Firm*—Morriss O'Bryant Compagni, P.C.

(57) ABSTRACT

A proximity-based mutually capacitance-sensitive touchpad that is disposed directly beneath a keypad keymat of a mobile telephone, wherein posts associated with each key pass through a mutually capacitance-sensitive sensor electrode grid of the touchpad such that the keypad posts do not interfere with touchpad detection and tracking of a pointing object that moves along the keypad surface, to thereby enable touchpad data entry, cursor control, and scroll bar control on a display of the mobile telephone, wherein the keypad posts actuate mechanical switches underneath the touchpad.

2 Claims, 8 Drawing Sheets

SYSTEM FOR DISPOSING A PROXIMITY SENSITIVE TOUCHPAD BEHIND A MOBILE PHONE KEYMAT

CROSS REFERENCE TO RELATED APPLICATIONS

This document claims priority to U.S. patent application Ser. No. 10/165,182, filed Jun. 6, 2002, now issued as U.S. Pat. No. 7,151,528.

BACKGROUND

1. The Field of the Invention

This invention relates generally to touchpads and mobile telephones. Specifically, the invention relates to adapting a touchpad so that it can be disposed and operated while underneath a keypad of a mobile telephone, wherein the user operates the keypad by pressing keys on a keymat in a typical manner, and wherein the touchpad disposed underneath the keymat can be activated to thereby enable manipulation of a display in the mobile telephone so as to control a cursor, scroll bars, and alphanumerical data entry in the mobile telephone.

2. Background of the Invention

Portable information appliances include portable communication devices known by many popular names such as cellular telephones, cell phones, and mobile telephones (hereinafter referred to collectively as "mobile telephones") to name a few. Mobile telephones are now capable of providing more services than just voice transmission. For example, mobile telephones now provide data services such as access to the Internet for web browsing and for using email. These services are becoming ubiquitous as the infrastructure to provide them is becoming more widely available.

There are several problems that inhibit use of these data services. Because these mobile telephones are small devices, there is a lack of surface space on them in which to implement data entry and display control technologies. A mobile telephone must typically rely on the keypad as the main source of alphanumerical data input and display control. Unfortunately, experience has shown that using the keypad for all types of data entry and display control is inefficient, slow, cumbersome, and frustrating to the user. Thus, while the ability to easily navigate a graphical interface such as a mobile telephone web browser and to rapidly enter text in a word processor in order to send email is highly desirable, it is unfulfilled.

It would therefore be an advantage over the prior art to provide a system that enables both rapid data entry and graphical display control in a portable information appliance, such as the mobile telephone. Ideally, the system should enable the mobile telephone to retain its conventional keypad, while providing a touchpad and the associated touchpad capabilities. However, the system should not require a separate touchpad surface. Thus, the system should incorporate a touchpad without modifying the appearance of the mobile phone. The touchpad could be disposed underneath the keymat and be actuated by a switch or other means of activation.

Alternatively, the touchpad could be disposed underneath a display screen, or underneath some portion of the body of the mobile telephone where a user can run a finger over a surface thereof. What is important is that the touchpad operate through proximity sensing, and thus not require direct contact with the touchpad in order to operate. The surface through which the touchpad could detect a pointing object could be the keymat of the keypad, an LCD display screen, or a portion of the body of the portable information appliance that is easily accessible by touch.

SUMMARY OF INVENTION

It is an object of the present invention to provide a proximity sensitive touchpad that is capable of providing touchpad functionality while disposed underneath a keymat of a keypad.

It is another object of the invention to provide the proximity sensitive touchpad such that a post for each key on the keymat passes through a mutually capacitive sensor electrode grid of the touchpad.

It is another object of the invention to modify spacing of the electrodes on the mutually capacitive sensor to enable the posts to pass through the electrode grid.

It is another object of the invention to bend or angle some of the electrodes around apertures disposed through the touchpad in order to enable mechanical switches to be actuated.

It is another object of the invention to modify sensor algorithms to compensate for the modified spacing and the bends or angles made in electrodes on the touchpad.

It is another object of the invention to provide a separate touchpad that provides dedicated functionality as a scrolling mechanism.

It is another object of the invention to provide the separate touchpad such that it is disposed to be accessible when the mobile telephone is closed, when the mobile telephone has a cover that can be closed.

In a preferred embodiment, the present invention is a proximity-based mutually capacitance-sensitive touchpad that is disposed directly beneath a keypad keymat of a mobile telephone, wherein posts associated with each key pass through a mutually capacitance-sensitive sensor electrode grid of the touchpad such that the keypad posts do not interfere with touchpad detection and tracking of a pointing object that moves along the keypad surface, to thereby enable touchpad data entry, cursor control, and scroll bar control on a display of the mobile telephone, wherein the keypad posts actuate mechanical switches underneath the touchpad.

In a first aspect of the invention, the electrode grid for the proximity-based mutually capacitance-sensitive touchpad is disposed on a flexible and non-conductive substrate material.

In a second aspect of the invention, holes are disposed through the substrate material to enable movement of the keypad posts up and down therethrough.

In a third aspect of the invention, the proximity-based mutually capacitance-sensitive touchpad operates with a sleep mode and an active mode to thereby conserve power, and prevent undesired touchpad operation when the keys are in use.

In a fourth aspect of the invention, the electrode grid is comprised of an etched copper on foil Capton GlideSensor.

In a fifth aspect of the invention, the proximity-based mutually capacitance-sensitive touchpad provides tap, double-tap, scroll control, and cursor control.

In a sixth aspect of the invention, the touchpad is not affected by the changing distance between the pointing object and the touchpad, enabling the pointing object to travel over keys and between keys without affecting touchpad performance.

In a seventh aspect of the invention, a separate touchpad is disposed along a side edge of the mobile telephone to provide dedicated scrolling capabilities.

These and other objects, features, advantages and alternative aspects of the present invention will become apparent to those skilled in the art from a consideration of the following detailed description taken in combination with the accompanying drawings.

DETAILED DESCRIPTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

The presently preferred embodiment of the invention is a proximity-based mutually capacitance-sensitive touchpad that is disposed directly beneath a keypad keymat of a mobile telephone. Keypad posts associated with each key pass through an electrode grid of the touchpad in such a way so that the posts do not interfere with touchpad detection and tracking of a pointing object that moves along the keypad surface. The keys of the keypad provide the first type of user input. The touchpad is capable of providing data entry, cursor control, and scroll bar control on a display of the mobile telephone. Thus, the touchpad provides the second type of user input. The keys of keypad provide discrete input in the form of alphanumerical characters. In contrast, the touchpad is an impedance sensing means. More specifically, the touchpad utilizes mutual capacitance-sensing technology to determine the location of a finger over a surface thereof.

Figure 1:
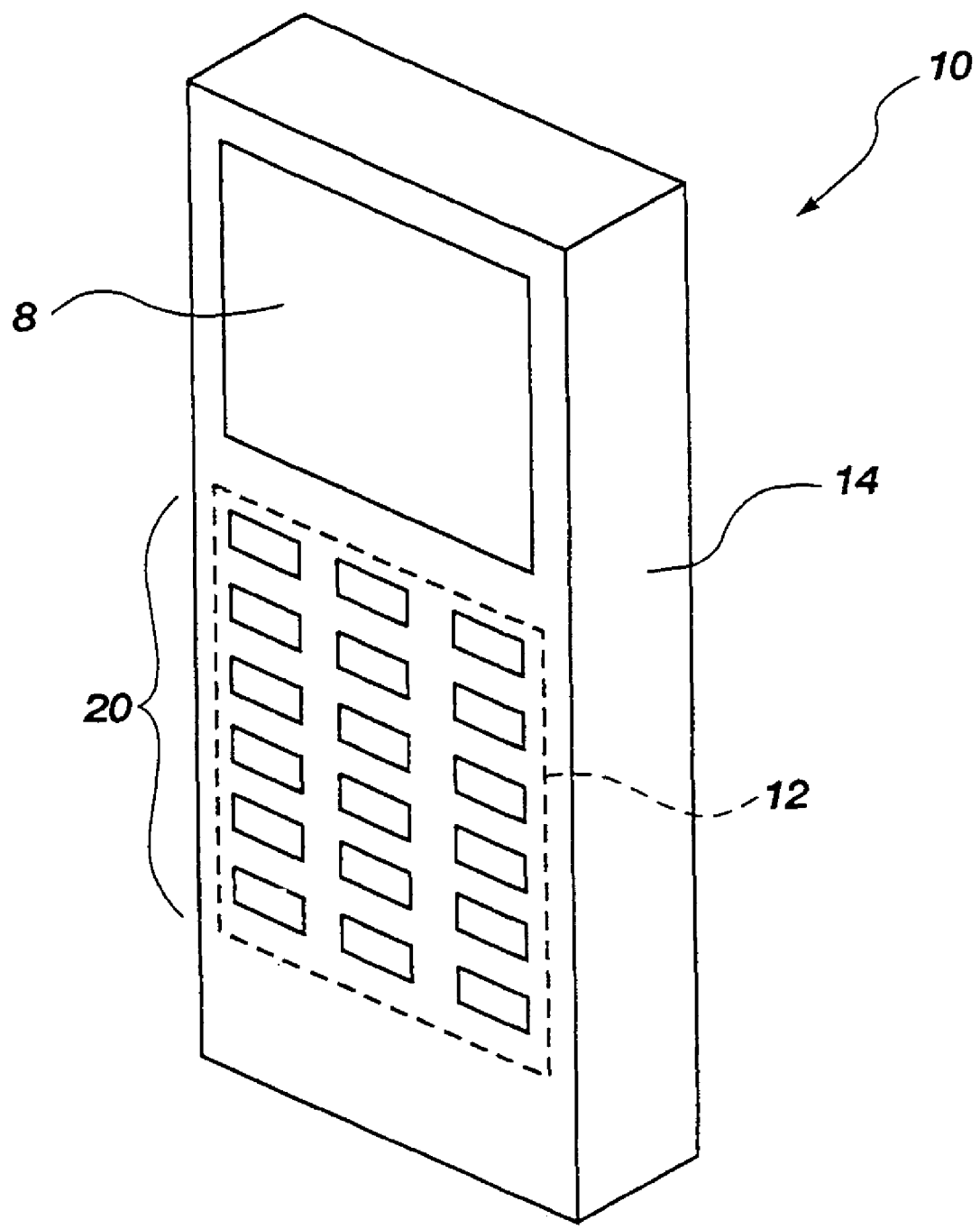
FIG. 1 is a perspective view of a typical mobile telephone, having the present invention disposed therein.

FIG. 1 is a perspective view of a typical mobile telephone 10. The dotted line 12 indicates the approximate location of the touchpad that is disposed underneath a plurality of keys 20. The plurality of keys 20 are the only visible portion of a keymat 22 (not shown) disposed underneath a hard housing 14. The keymat 22 is the first layer of a keypad 18. The keypad 18 includes all of the components that enable the plurality of keys 20 to actuate corresponding mechanical switches, and in this invention, also includes the touchpad which is integrally disposed therein. The mobile telephone includes a display screen 8, and may also include some external antenna (not shown). Inside the mobile telephone is disposed a power source such as a rechargeable battery, and the electronic circuitry for the telephone and for the touchpad.

Figure 2:
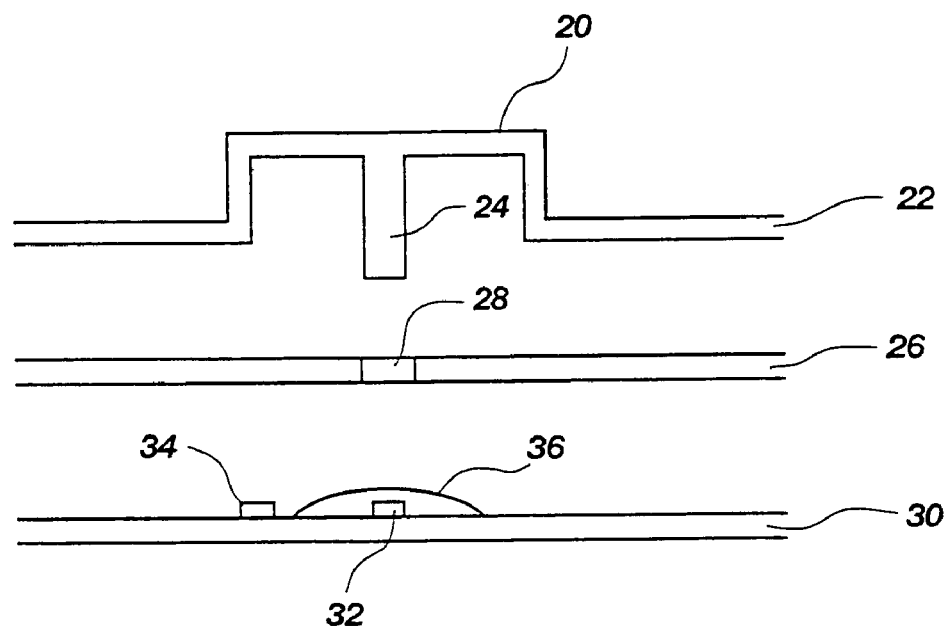
FIG. 2 is a close-up, expanded, profile and cross-sectional view of a portion of the keypad.

FIG. 2 is a close-up and expanded profile and cross-sectional view of a portion of the keypad 18. This view shows a single key of the plurality of keys 20 that are part of the keymat 22. The key 20 is typically a rubber-like material which is able to deform. However, the key 20 can also be formed of a rigid material. What is important is that the material used for the key 20 does not interfere with the operation of the touchpad. In (other words, the key 20 should not interfere with the detection of mutual capacitance between electrode grids of the touchpad, and the modification of the mutual capacitance caused by a pointing object such as a finger.

The key 20 includes a post 24 that is utilized to actuate a mechanical switch 32 when the key is pressed. The key 20 can be any desired shape. What is notable is that the key 20 is typically a raised shape so that the key protrudes outwards through and slightly above the hard housing 14. Alternatively, the key 20 can be flush with the surface of the hard housing 14 but this configuration is probably avoided to provide better feedback to the user. Another alternative would be to have the keymat 22 exposed, without any surface of the hard housing to cover it.

Actuation of the mechanical switch 32 is accomplished when the post 24 presses down on a dome structure 36 that is disposed over it. The dome 36 also functions as a spring to push the post 24 back to a rest or unactivated position. The post 24 rests on or adjacent to the dome 36. The dome 36 thus provides a tactile response that is desirable with actuation of a mechanical switch.

Typically, the keymat 22 is a structure without apertures through its surface. Instead, the keymat 22 is formed to provide a location for the plurality of keys 20 to be disposed. Thus, each of the plurality of keys 20 is typically a separate component that is joined with or otherwise fused to the keymat 22. However, this configuration should not be considered limiting, and the keymat 22 can be formed having integral keys 20. Another alternative would be to eliminate the keymat 22 altogether, wherein individual keys would not have a structure to hold them together.

In FIG. 2, a touchpad 26 is disposed directly underneath the keymat 22. A plurality of apertures 28 are disposed through the touchpad 26 to enable passage of the posts 24 connected to each of the plurality of keys 20. The structure of the touchpad 26 is a novel aspect of the invention to be described in detail in other figures.

Disposed underneath the touchpad 26 is a switch substrate 30. The switch substrate 30 is typically a rigid material such as printed circuit board (PCB). FIG. 2 shows a mechanical switch 32 disposed on the switch substrate 30. Also shown disposed on the switch substrate 30 is an LED 34 that is adjacent to the mechanical switch 32 and the dome 36. A plurality of LEDs 34 on the switch substrate provide illumination that is typically seen through the plurality of keys 20. Accordingly, the key 20 will be transparent or at least translucent to thereby allow the illumination from the LED to be visible therethrough. It should be apparent that at least a portion of the keymat 22 where the key 20 is disposed will also be transparent or translucent for the illumination to be visible.

What is important to recognize in FIG. 2 is that the key 20 must be capable of easy actuation of a mechanical switch 32 in order for the mobile telephone to be usable. In other words, the touchpad should not interfere with operation of the plurality of keys 20. But in order to provide touchpad functionality, the touchpad 26 must be located as close to the keymat 22 and the key 20 as possible. In this preferred embodiment, a novel aspect of the invention is that the aperture 28 makes operable the configuration of the keypad 18 shown in FIG. 2.

In order to provide touchpad functionality to the mobile telephone, a plurality of keys 20, posts 24, corresponding apertures 28 through the touchpad 26, and mechanical switches 32 are required. These structures are arranged as shown in FIG. 3.

Figure 3:
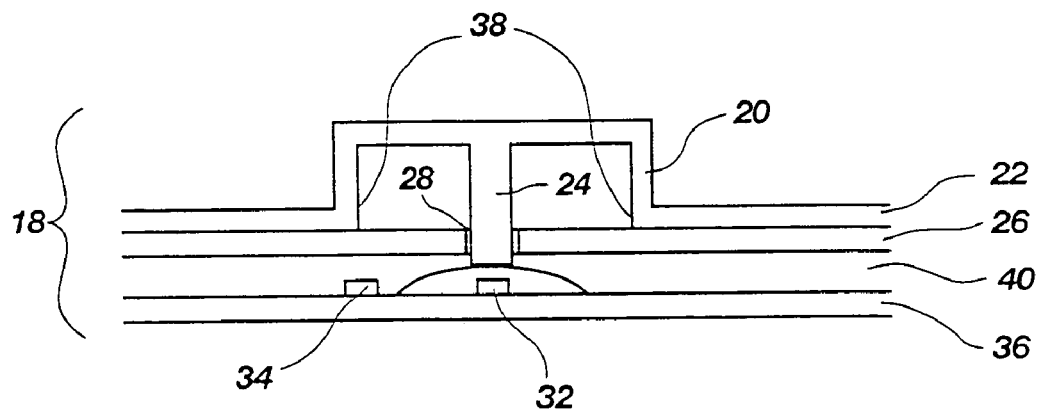
FIG. 3 is a close-up profile cross-sectional view of a portion of the keypad.

FIG. 3 is a close-up profile cross-sectional view of a portion of the keypad 18, wherein the key 20 having post 24 is disposed over aperture 28 through the touchpad 26. The post 24 is adjacent to or even resting on the dome 36. The switch substrate 30 is shown spaced apart some distance by gap 40 to enable the dome 36 to be actuated by the post 24.

Another important and novel aspect of the invention is that in order for the illumination provided by the LED 34 to be visible through the key 20 that the intervening substrate of the touchpad 26 must also be transparent or at least translucent. Furthermore, the material used in the touchpad is important for reasons other than illumination.

It is observed that there are methods of illumination available other than LEDs. For example, electroluminescent lighting may be used in mobile telephones. However, it would be necessary to provide the same apertures through the electroluminescent lighting as are through the touchpad. This may be difficult because of the manufacturing methods currently used. However, a plurality of discrete electroluminescent panels might be disposed under the touchpad 26.

In the presently preferred embodiment, the touchpad being utilized comes from the GLIDESENSOR™ technology of CIRQUE™ Corporation. This technology provides a flexible substrate for the sensor grids of the mutually capacitance-sensitive touchpad. The flexible substrate is not only capable of conforming to arcuate surfaces, such as the underside of the keymat 22, it is also capable of being slight deformed. This is important because when the key 20 is being pressed so that the post 24 depresses the dome 36 and actuates the mechanical switch 32, the edges 38 of the key 20 will be pressing on and slightly deforming the touchpad 26. This movement of the touchpad 26 should be minimized in order to reduce damage that might occur to electrodes disposed thereon.

The GLIDESENSOR™ touchpad 26 provides another capability that is critical to successful operation of the touchpad in the mobile telephone. The touchpad 26 is providing proximity sensing. Proximity sensing is the ability to detect a pointing object on the plurality of keys 20 or the space between the keys. Proximity sensing is thus the ability to detect a pointing object, in this case a finger, without direct contact with a sensing surface of the touchpad 26.

GLIDESENSOR™ is uniquely suited to provide this enhanced z-axis proximity sensing capability as described in the co-pending applications. Essentially, the increased dynamic range of the touchpad as provided by the integrated circuit at the heart of the touchpad circuitry. The increased dynamic range is made possible for several underlying reasons such as not having to throw away the smallest measurement bits because a more accurate analog-to-digital (A/D) converter is being used. More specifically, it was determined that the noise within the A/D converter itself was responsible for having to throw away measurement data that could not be considered reliable. Thus, the techniques used for electronic noise reduction within the touchpad circuitry resulted in substantial improvement in performance.

Another factor is an unexpected result which came about as a consequence of the A/D converter. Specifically, the number of measurement readings or "sampling" taken by the measurement circuitry could be doubled to thereby cause a decrease in the noise of the A/D converter.

Together, the decreased noise of the A/D converter and the two-fold increase in the number of samples of the measurement circuitry have combined to create at least a four-fold increase in accuracy of the touchpad sensing circuitry.

Another factor is that the present invention utilizes mutual capacitance-sensing technology. One particular advantage of this technology is that the electrode grid comprised of separate X and Y electrodes, and taught in CIRQUE™ Corporation U.S. Pat. Nos. 5,305,017, 5,565,658, and 5,861,875, is that the technology does not depend upon having a well established earth ground. Mutual capacitance enables detection of a finger changing the capacitance between the X and Y electrodes. An earth ground is not important in its measurement methodology. Thus, the increase in touchpad sensitivity combined with the advantages of mutual capacitance technology enable the CIRQUE™ touchpad to accomplish accurate proximity sensing.

It is important to recognize that the touchpad technology of the present invention also had to be significantly modified to operate in the environment of a mobile telephone.

One modification is the material being used for the substrate of the touchpad. A typical mutual capacitance-sensitive touchpad is comprised of an X and a Y electrode grid. As taught in the co-pending applications, the electrode grids of the present invention are formed on a flexible and non-conductive material. There are several products on the market which can be used for this purpose. But even plastic or MYLAR™ can be used.

More specifically for materials, the present invention requires a flexible substrate, and has used polyethylene terephthalate (PET) to fulfill this role. However, PET is typically not transparent. It is typically a dark amber-like material that may not allow enough light through to illuminate the keys if it is used for the touchpad. Thus, the presently preferred embodiment utilizes a clear or more transparent film for the substrate, such as polyethylene naphalate (PEN). Thus, any film with suitable properties can be used such as a polyester or polyimide film with suitable transparency characteristics.

Another important property of the touchpad substrate in the presently preferred embodiment is that it be capable of being soldered. It is desirable to solder electrical connectors and/or components directly to the touchpad substrate material. PET has a melting point that is typically below that of solder. However, PEN has a higher temperature coefficient that is slightly above solder, and can be used for the touchpad substrate.

Another advantageous property of the touchpad substrate is that it should be thin enough to provide the flexibility to conform tightly to the underside of the keymat 22. Therefore, the touchpad substrate should have desirable transparency characteristics, temperature coefficient, flexibility, and be thin and non-conductive.

Figure 4:
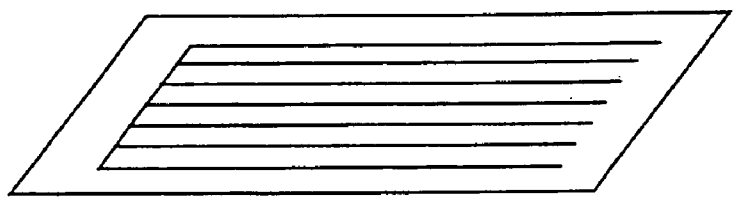
FIG. 4 is an illustration of the prior art that shows that an X electrode grid separated from a Y electrode grid by some dielectric insulating material.
Figure 4:
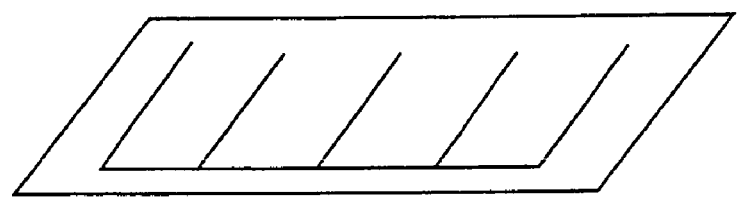

The electrode grids can be formed in various ways that are well known to those skilled in the art and are explained in the previously cited CIRQUE™ patents. FIG. 4 is an illustration of the prior art that shows that an X grid 50 be separated from a Y grid 52 by some dielectric insulating material. Thus, the X grid 50 can be disposed on a first substrate 54, the Y grid 52 can be disposed on a second substrate 56, and the first substrate is coupled to the second substrate, with the upper substrate 56 forming the intervening dielectric insulating material.

Figure 5:
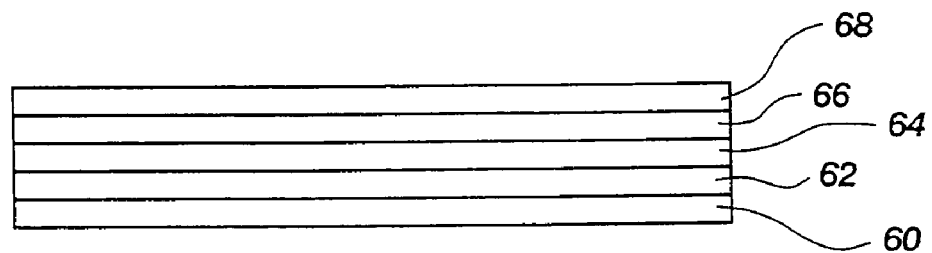
FIG. 5 is a cross-sectional profile view of the touchpad that is made in accordance with the presently preferred embodiment.

More specifically in the present invention, FIG. 5 is provided to illustrate the presently preferred embodiment and layout characteristics of the touchpad 26. FIG. 5 is a cross-sectional profile view of the touchpad 26 of the presently preferred embodiment. The base substrate has a first electrode grid layer 62 disposed thereon. This could be the X or the Y grid. The next layer is a dielectric insulating material 64 that is well known to those skilled in the art. Then a second electrode grid 66 is disposed on top of the dielectric insulating material 64. Another insulating and protective layer 68 is typically disposed on top of the second electrode grid 66 simply to prevent damage. This protective layer 68 is typically the same dielectric insulating material used between the electrode grid layers 62, 66.

The process for disposing the electrode grid layers 62 and 66 on the substrate 60 and the dielectric insulating material 64 is taught in the co-pending applications. However, it can be summarized as the silk screening of a conductive ink, such as indium-tin-oxide (ITO). However, by utilizing PEN or other similar film as the substrate 60, it is also possible to etch copper on one side of the substrate 60, and print the conductive ink on the other. Through-holes in the substrate can then be used to connect the electrode grids to copper traces. The ability to etch copper enables connections to be made to electronic components that are also disposed directly onto the substrate 60, and eliminate the need to provide a means for coupling to off-board electronics.

An important aspect of the invention can now be illustrated in the following figures. Beginning with FIG. 6, this figure shows a top view of one of the electrode grids. For purposes of example only, it will be referred to as the Y electrode grid layer 62. The Y electrode grid 70 is comprised of various electrode fingers as shown. The electrode grid 70 is surrounded by a grounding ring electrode 72 to reduce noise interference.

A significant new feature on the Y electrode grid layer 62 that is different from previous touchpads manufactured by CIRQUE™ Corporation are the apertures 28. There is an aperture 28 for each of the keys 20 on the keypad 18 of the mobile telephone 10. Thus, the exact placement and number of apertures 28 may vary, depending upon the style and keypad 18 layout of the mobile telephone being used. This embodiment of twenty-one keys is illustrative only. Furthermore, the number of columns and rows can be adjusted as needed.

A significant feature of the Y electrode grid 70 is that some of them are not straight. Two of the electrodes 70 are forced to bend around the apertures 28. Performance of the touchpad 26 with electrodes that have a non-linear portion can be affected significantly. Fortunately, the present invention is able to compensate for the electrodes having a non-linear portion. This is accomplished using an offset.

The offset is a function of known index locations. For example, a typical CIRQUE™ touchpad utilizes a 12 electrode by 16 electrode grid. This provides 192 raw index locations from which to determine the position of a finger. Because of the smaller dimensions of the mobile telephone, it is necessary to reduce the total number of electrodes in both the X and Y electrode grid layers 62, 66. In the preferred embodiment, the electrode grid is now 6 electrodes by 8 electrodes. In this embodiment, there are 8 Y electrodes 70, and 6 X electrodes 74. That means that there are one fourth (6×8=48) the total number of raw index locations to use in determining the location of the finger over the touchpad 26, as compared to a typical CIRQUE™ touchpad. This situation makes the touchpad more difficult to implement because of the restricted size of the area in which it can operate.

Figure 7:
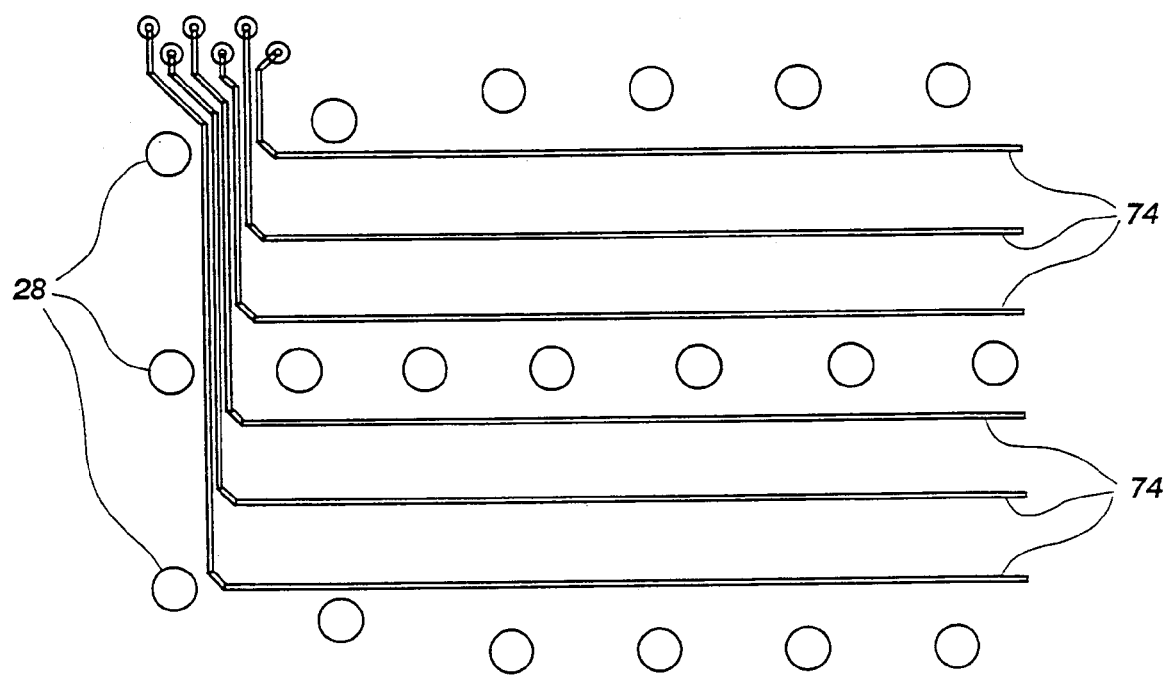
FIG. 7 shows a top view of the X electrode grid described in FIG. 5.

FIG. 7 is a figure showing a top view of the X electrode grid layer 66. The X electrodes 74 are disposed as shown.

An important feature to notice is that not only are some of the Y electrodes 70 nonlinear, but the spacing between Y electrodes 70 and the X electrodes 74 is non-uniform. Just like the nonlinear Y electrodes, this fact compromises performance of the touchpad 26. In order to compensate, it is necessary to use the same technique of using offsets. This is only possible because the location of the nonlinear portion of the electrodes and the spacing between all of the electrodes is known. Thus, the offsets would be different depending upon the specific electrode spacing and bending around apertures 28. This feature of being able to provide these offsets in order to accurately determine finger location over the touchpad is a novel aspect of the present invention.

Figure 6:
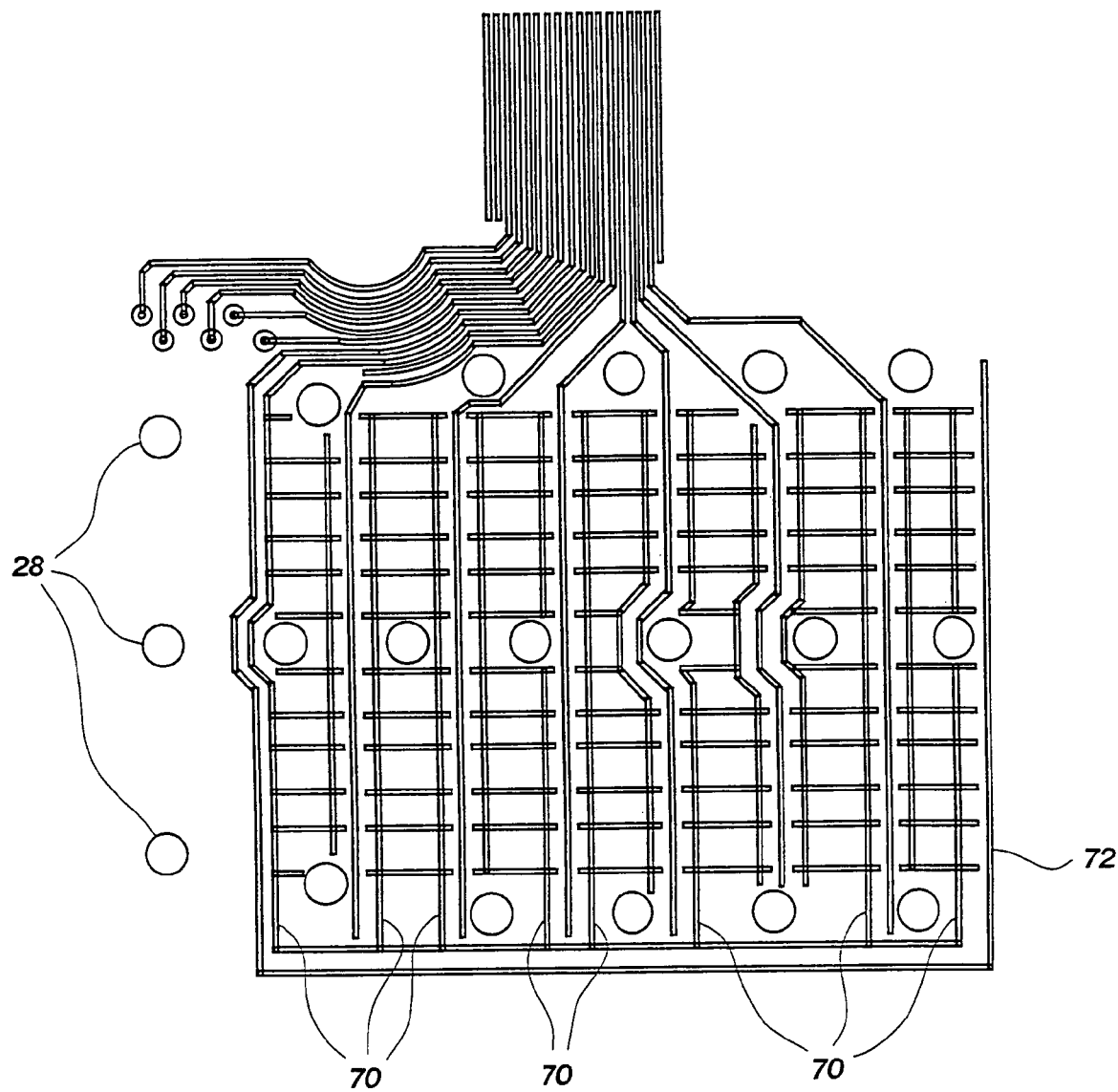
FIG. 6 shows a top view of the Y electrode grids described in FIG. 5.
Figure 8:
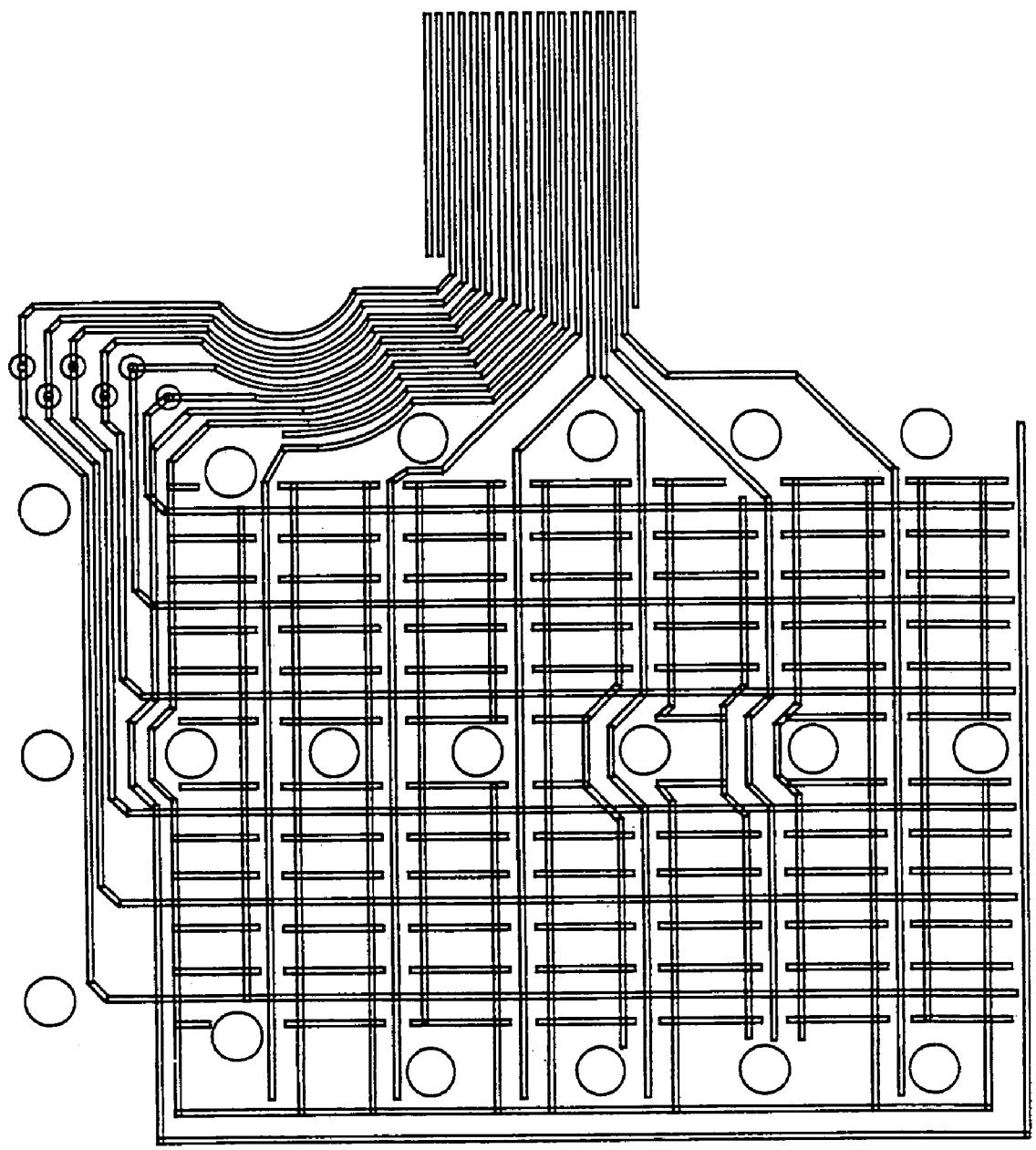
FIG. 8 illustrates the look of the touchpad after all of the overlapping electrode layers are disposed on the touchpad substrate.

FIG. 8 is provided to illustrate the look of the touchpad after all of the overlapping electrode layers 62, 66 are disposed on the touchpad substrate 60. It should be understood that the scale of FIGS. 6, 7 and 8 is not actual size. The electrode grid layers 62, 66 were expanded to make them easier to see. Not mentioned but part of the touchpad is the touchpad circuitry that is coupled to the electrode grid layers 62, 66. The touchpad circuitry is designed to detect and localize any disturbance that interferes with the mutual capacitance between the electrode grid layers 62, 66. This concept is explained in the parent applications and the previously cited CIRQUE™ Corporation patents.

An important aspect of the invention is to bring touchpad functionality to the mobile telephone. This functionality includes the ability to perform scrolling, tapping, double-tapping, and cursor control. This functionality is all part of the touchpad 26, and are new to the application of a mobile telephone.

Figure 9:
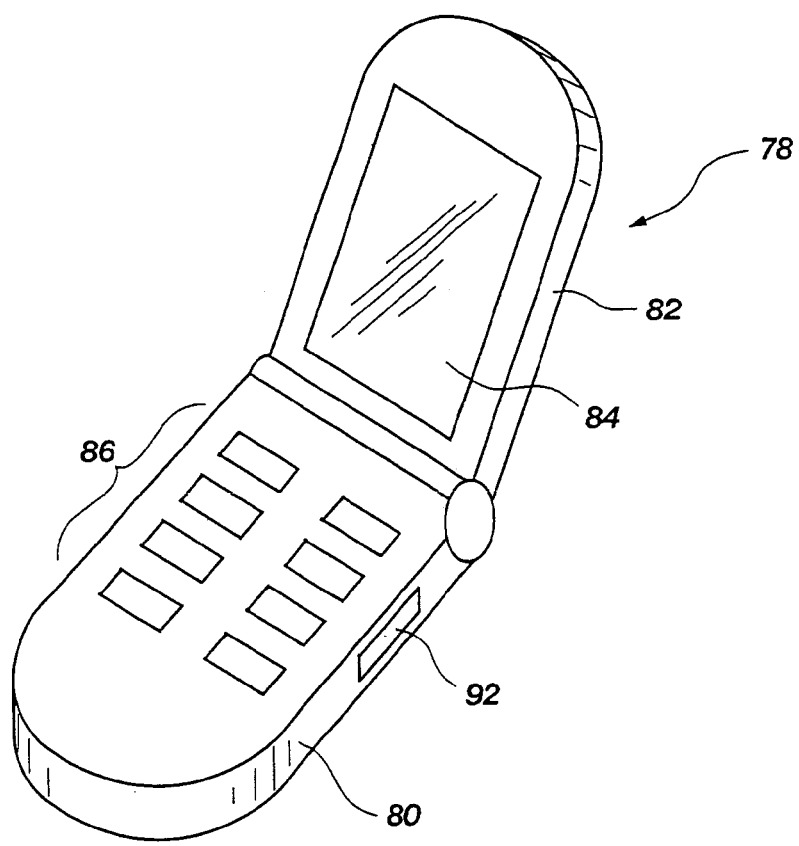
FIG. 9 is an illustration of a different physical configuration of a mobile telephone.

FIG. 9 is an illustration of a different physical configuration of a mobile telephone 78. The mobile telephone 78 has a base portion 80, and a cover portion 82. The cover portion 82 will typically include a display screen, such as the LCD display screen 84 shown here. The base portion 80 will typically include the keypad 86. Alternatively, a different type of display screen technology may be used. This may be an advantage if the touchpad 26 can be more easily disposed behind the display screen in an alternative embodiment. Other display screen technology includes plasma displays and electronic ink displays.

Figure 10:
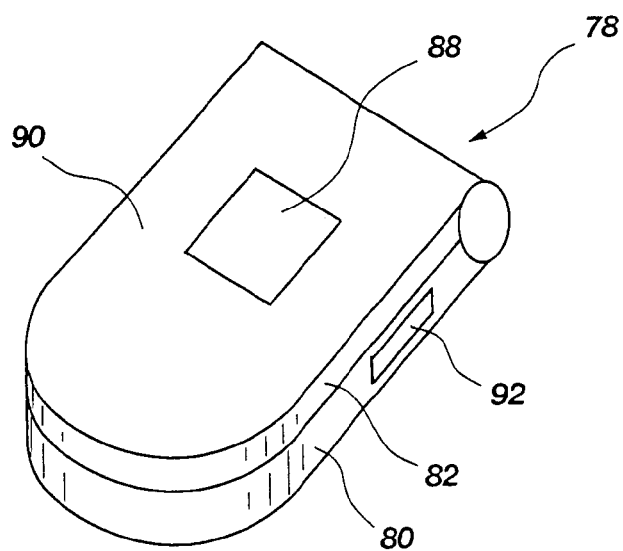
FIG. 10 is an illustration of the mobile telephone of FIG. 9 with the cover closed.

The purpose of providing this illustration is that it may be desirable to provide some touchpad functionality in more than one location in the mobile telephone. For example, the mobile telephone shown in FIG. 9 and shown in FIG. 10 with the cover portion 92 closed includes a small LCD display screen 88 on the back 90. The display screen 88 can be used to indicate, for example, the identity of a caller or some other mobile telephone function. What is important to understand is that when using this type of mobile telephone 78, it is often desirable not to have to open the mobile telephone to perform some touchpad functions on the display screen 88.

Another example is using the display screen to provide access to a list of telephone numbers in a telephone directory stored in memory. A touchpad is a very convenient method of scrolling. However, mechanical scrolling wheels can be easily actuated at undesirable moments. Furthermore, reliability is an issue because the internal mechanical mechanism of a mechanical scrolling wheel is open to the elements. In contrast, it is much harder to actuate a touchpad that requires the use of a finger to move across it. In addition, the electronic circuitry of the touchpad is hidden inside the hard housing 14.

Accordingly, it is another aspect of the present invention to provide a small touchpad separate from the touchpad 26 underneath the keymat 22 that has limited touchpad functionality. For example, a small touchpad 92 is shown disposed along a edge or side of the mobile telephone 78. This touchpad 92 can provide scrolling functionality for the display screen 88. The touchpad 92 can be disposed flush with the hard housing 14, or it can be disposed beneath the hard housing. Some delineation on the hard housing 14 should then be provided to indicate the location of the touchpad 92.

The user would simply move a thumb or finger along the touchpad 92 to perform scrolling, the direction of movement causing scrolling up or down.

Regarding actuation of the touchpads 26 and 92, there are many ways that this could be accomplished. For example, application actuation could be accompanied by actuation of the appropriate touchpad. Consider a mobile telephone web browser application being actuated by the receipt of an email message. Starting the web browser could occur simultaneously with actuation of the touchpad, enabling the user to manipulate a cursor in a graphical web browser environment. The user could then cause the email message to be displayed on the display screen 8.

Touchpad actuation thus may be automatic, in response to actuation of a specific activity or program that relies on touchpad functionality to operate. In contrast, touchpad actuation may also be performed manually through a dedicated switch. The switch can be disposed near the keys 20 of the keypad 18. These methods might also be combined, or customized by the user, wherein selected applications cause automatic actuation of the touchpad, and others do not without manual intervention.

It is observed that the touchpad 92 may be activated by certain activities being displayed on the display screen 88. This would enable the user not to have to open the mobile telephone to actuate the touchpad 92, and yet prevent accidental actuation that might otherwise be caused by carrying the mobile telephone in a bag or purse.

Figure 11:
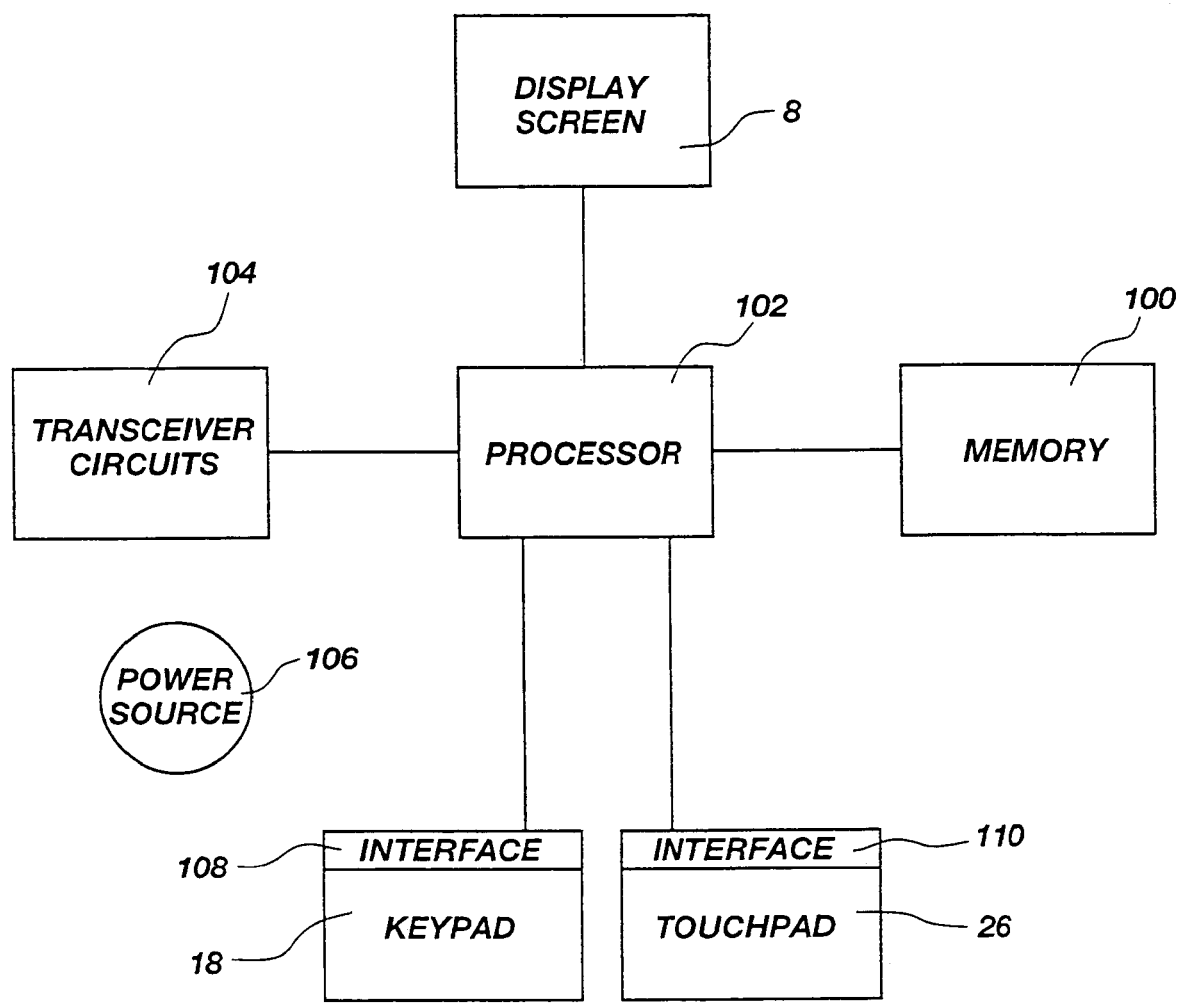
FIG. 11 is a block diagram of the basic components of the mobile telephone.

FIG. 11 is provided as a very basic block diagram of the components of the present invention when disposed within a mobile telephone. These components include the display screen 8, a memory module 100 for storing data, a processor 102 for controlling operation of the various components, transceiver circuits 104 for controlling transmission and reception of data, including voice data, a power source 106 for providing power for all operations of the mobile telephone, an interface 108 to the data from the mechanical switches 32 actuated by keys 20 on the keypad 18, and an interface 110 to data from the touchpad 26. It should be recognized that the mobile telephone may include more components, such as card readers or other memory devices. This figure should only be considered a typical example.

While the presently preferred embodiment teaches the integration of the touchpad 26 into the keypad 18, it should be recognized that the touchpad 26 might be located elsewhere. The touchpad 26 could be disposed underneath the hard housing 14 and operate in proximity sensing mode. The touchpad 26 could also be disposed in a location where the hard housing 14 has been cut away to reveal a surface of the touchpad so that it operates by direct touch. It should also be considered an aspect of the present invention to provide a touchpad that is disposed under more than one location, such as under the keymat 22, and also under a portion of the hard housing 14. The touchpad 26 might also be disposed under the LCD display screen 8 so as to operate similar to a touch screen as understood by those skilled in the art.

Another aspect of the invention is a power mode for the touchpad 26. While actuation of the touchpad may be automatic or manual, deactivation may also be automatic or manual. Because the presently preferred embodiment is utilization in a portable information appliance such as the mobile telephone, power consumption is an issue. The touchpad 26 can be designed to go into a sleep mode if no activity is detected for a selectable period of time. However, the user may complete a task, and desire to return to use of the keys 20, or simply desire to not use the mobile telephone. Accordingly, a manual switch may be provided in order to deactivate the touchpad and force it into a sleep mode if the mobile telephone is not being turned off, but left in a phone answering mode.

It may not be desirable to dedicate a switch to the sole task of touchpad activation or deactivation. Accordingly, it may be preferable to enable a sequence of keys 20 to be pushed to perform this function manually. It could also be made a menu item on the display screen 8 that is selectable by using the touchpad itself.

The presently preferred embodiment of the mobile telephone is only one example where the present invention may be utilized. The invention is best suited for use in any of a variety of portable information appliances, such as mobile telephones. However, other devices such as personal digital assistants (PDAs), laptop computers, tablet personal computers, or similar mobile computing devices can also benefit from the present invention.

However, the present invention does not need to be limited strictly to portable information appliances either. The ability to provide a touchpad that is integrated with another input means such as a keypad can be used in any place that a keypad is found, such as in a computer keyboard, and even in a panel of electronic instrumentation such as in an automobile or aircraft.

Another alternative embodiment that should be addressed is the elimination of mechanical keys. This is accomplished by utilizing the touchpad as both the keypad and the touchpad. In other words, it is possible to switch modes of the touchpad. In keypad mode, the touchpad provides a plurality of discrete regions, each region corresponding to a discrete key of the keypad. When switched to touchpad mode, the touchpad surface operates with touchpad functionality, for example, to provide cursor control.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A portable electronic appliance comprising:
   an arcuate keypad surface having a plurality of keys, wherein each of the plurality of keys is arranged so as to actuate a respective mechanical switch so as to provide a first type of user input; and
   an impedance sensing means disposed integrally with the arcuate keypad surface so as to provide a second type of user input that is characterized as non-mechanical, wherein the impedance sensing means operates as a proximity sensitive touchpad beneath the arcuate keypad surface, wherein the impedance sensing means is of a size that is always adaptable for use in a hand-held device, and wherein the impedance sensing means is disposed under the arcuate keypad surface.

2. The portable electronic appliance as defined in claim 1 wherein the arcuate keypad surface is comprised of a material that does not interfere with operation of the impedance sensing means.

* * * * *